(12) United States Patent
Jones et al.

(10) Patent No.: US 11,052,387 B2
(45) Date of Patent: Jul. 6, 2021

(54) METHOD AND DEVICE FOR THERMAL INSULATION OF MICRO-REACTORS

(71) Applicants: IMEC, Leuven (BE); Katholieke Universiteit Leuven, K.U. LEUVEN R&D, Leuven (BE); Panasonic Corporation, Osaka (JP)

(72) Inventors: Ben Jones, Leuven (BE); Paolo Fiorini, Brussels (BE); Hiroyuki Tanaka, Osaka (JP)

(73) Assignees: IMEC VZW, Leuven (BE); Katholieke Universiteit Leuven, KU LEUVEN R&D, Leuven (BE); Panasonic Corporation, Osaka (JP)

( * ) Notice: Subject to any disclaimer, the term of this patent is extended or adjusted under 35 U.S.C. 154(b) by 893 days.

(21) Appl. No.: 13/625,247

(22) Filed: Sep. 24, 2012

(65) Prior Publication Data

US 2013/0078155 A1 Mar. 28, 2013

(30) Foreign Application Priority Data

Sep. 23, 2011 (EP) .................................... 11182533

(51) Int. Cl.
*C01B 3/34* (2006.01)
*B01L 3/00* (2006.01)
*B01L 7/00* (2006.01)
*B81B 3/00* (2006.01)
*B81B 7/00* (2006.01)

(52) U.S. Cl.
CPC ... *B01L 3/502707* (2013.01); *B01L 3/502715* (2013.01); *B01L 7/52* (2013.01); *B81B 3/0081* (2013.01); *B81B 7/0087* (2013.01); *B01L 2200/147* (2013.01);

(Continued)

(58) Field of Classification Search
CPC ................ B01L 3/502707; B01L 7/52; B01L 3/502715; B01L 2300/0816; B81B 7/0087; B81B 3/0081; B81B 2201/051
See application file for complete search history.

(56) References Cited

U.S. PATENT DOCUMENTS 4,963,498 A * 10/1990 Hillman ................ B01F 5/0618
356/28
5,965,410 A * 10/1999 Chow .................... B01L 3/5027
204/450

(Continued)

OTHER PUBLICATIONS

Woolley et al., "Analytical Chemistry" 68 (1996) 4081-4086, 6 pages. (Year: 1996).*

(Continued)

*Primary Examiner* — Bobby Ramdhanie
*Assistant Examiner* — Denise R. Anderson
(74) *Attorney, Agent, or Firm* — McDonnell Boehnen Hulbert & Berghoff LLP

(57) ABSTRACT

A micro-fluidic device is described. The micro-fluidic device includes a semiconductor substrate; at least one micro-reactor in the semiconductor substrate; one or more micro-fluidic channels in the semiconductor substrate, connected to the at least one micro-reactor; a cover layer bonded to the semiconductor substrate for sealing the one or more micro-fluidic channels; and at least one through-substrate trench surrounding the at least one micro-reactor and the one or more micro-fluidic channels.

16 Claims, 7 Drawing Sheets

(52) U.S. Cl.
CPC ............... *B01L 2300/0816* (2013.01); *B01L 2300/1805* (2013.01); *B01L 2300/1883* (2013.01); *B81B 2201/051* (2013.01)

(56) References Cited

U.S. PATENT DOCUMENTS

| | | | |
|---|---|---|---|
| 6,755,952 B1 * | 6/2004 | Yamamoto | G01N 27/44721 204/601 |
| 2002/0025280 A1 * | 2/2002 | Chazan et al. | 422/102 |
| 2002/0115200 A1 * | 8/2002 | Zou et al. | 435/303.1 |
| 2006/0246490 A1 * | 11/2006 | Anderson | B01F 11/0071 435/6.11 |
| 2007/0196237 A1 * | 8/2007 | Neuzil et al. | 422/67 |
| 2010/0197063 A1 * | 8/2010 | Bluzer | B81B 3/0081 438/51 |

OTHER PUBLICATIONS

U.S. Appl. No. 13/625,247, Portion of Office Action dated Nov. 1, 2017, 5 pages. (Year: 2017).*
European Search Report, European Patent Application No. 11182533.7 dated Mar. 16, 2012.
Zhang, Lian et al., "Measurements and Modeling of Two-Phase Flow in Microchannels With Nearly Constant Heat Flux Boundary Conditions", Journal of Microelectromechanical Systems, vol. 11, No. 1, Feb. 2002, pp. 12-19.
Ke, Cathy et al., "Single Step Cell Lysis/PCR Detection of *Escherichia coli* in an Independently Controllable Silicon Microreactor", Sensors and Actuators B, vol. 120, 2007, pp. 538-544.
Kosar, Ali et al., "Boiling Heat Transfer in Rectangular Microchannels With Reentrant Cavities", International Journal of Heat and Mass Transfer, vol. 48, 2005, pp. 4867-4886.

* cited by examiner

METHOD AND DEVICE FOR THERMAL INSULATION OF MICRO-REACTORS

CROSS REFERENCE TO RELATED APPLICATIONS

Pursuant to the provisions of 35 U.S.C. § 119(b), this application claims priority to EP11182533.7 filed Sep. 23, 2011, the entire contents of which are incorporated herein by reference.

FIELD

The present invention relates to thermal properties of micro-structures on a microchip. More in particular, the invention relates to thermal insulation of micro-reactors on a microchip and to a method of manufacturing thereof.

BACKGROUND

A micro-reactor, also called a micro-structured reactor or a micro-channel reactor, is a device in which chemical reactions take place in a confinement with typical lateral dimensions of a few mm or below. Micro-reactors are cavities of microscopic dimensions; they feature systems for controlling their temperature based on heaters and thermometers, which can optionally be integrated within the micro-reactor itself. Micro-reactors offer many advantages over conventional scale reactors, including vast improvements in energy efficiency, reaction speed and yield, safety, reliability, scalability, on-site/on-demand production, a much finer degree of process control and reduced consumption of reagents.

Micro-reactors are fabricated on a plurality of substrates whereby thermally insulating substrates are preferred. In some cases, however, it is necessary to fabricate the micro-reactors together with other fluidic or non-fluidic components, which are preferably fabricated in silicon. Silicon, however, is a material with high thermal conductivity. Whether the micro-reactors on-chip are standalone micro-reactors, or whether they are part of an array of micro-reactors, e.g., to analyze a variety of targets in parallel, it is important that increasing temperature in the micro-reactors is not exposed or limited to nearby components or micro-reactors. Apart from the exothermal reactions that take place in the micro-reactor it is desirable that the power to increase temperature in the micro-reactor is minimized.

It can be concluded that thermal insulation of the micro-reactor is necessary in order to minimize the power necessary for increasing its temperature and to avoid heating of nearby components.

In "Single step cell lysis/PCR detection of *Escherichia coli* in an independently controllable silicon microreactor," Sensors and Actuators B 120 (2007) pp. 538-544, Cathy Ke et al. describe a micro-reactor designed and modeled to examine thermal properties such as temperature uniformity, power consumption, heating and cooling rates. The micro-reactor contains an etched thermal isolation channel around the reaction cavity, which provides insulation from the surrounding silicon substrate. This channel improves the thermal performance. The depth of the reaction cavity is equal to the depth of the etched thermal isolation channel causing thermal properties of the micro-reactor to be inadequate, in view of parasitic heat dissipation through the substrate.

In "Boiling heat transfer in rectangular microchannels with reentrant cavities," International Journal of Heat and Mass Transfer 48 (2005) pp. 4867-4886, Ali Kozar et al. describe conducted boiling heat transfer experiments in flow through microchannels with reentrant cavities. Insulation cavities are etched in a silicon substrate adjacent to an array of microfluidic channels. The insulation trenches are etched the full depth of the wafer prior to anodic bonding. The fabrication procedure is not practical for insulating micro-reactors since the thermal insulation trench leaves the micro-reactor weakly supported.

In "Measurements and Modeling of Two-Phase Flow in Microchannels With Nearly Constant Heat Flux Boundary Conditions," Journal of Microelectromechanical Systems, Vol. 11, No. 1, February 2002, Zhang et al. describe a 2 cm long beam attached to silicon plates on both ends for thermal insulation. The full-depth thermal insulation etch is performed after mounting the wafer to a support wafer with photoresist, thus requiring supplementary steps. The device chip comprising the beam is then anodically bonded to Pyrex. For this anodic bonding, the support wafer should be removed to avoid carbonization of the resist or degradation of any other type of adhesive which could be used. It is a disadvantage that the method to fabricate the device as described faces the problem of handling a perforated wafer. Furthermore, the method described does not allow complicated insulation trench geometries without jeopardizing the mechanical robustness of the device.

It can be concluded that there is a clear need for thermally insulated devices on microchips, such as micro-reactors.

SUMMARY

It is an object of embodiments of the present invention to provide thermally insulated devices, such as micro-reactors, on microchips, and a method of manufacturing thereof. The above objective is accomplished by a method and device according to the present invention.

In a first aspect, the present invention provides a microfluidic device comprising:

a semiconductor substrate, e.g. a silicon substrate, for example a biocompatible semiconductor substrate;

at least one micro-reactor in the semiconductor substrate;

one or more micro-fluidic channels in the semiconductor substrate, connected to the at least one micro-reactor;

a cover layer bonded to the semiconductor substrate for sealing the one or more micro-fluidic channels; and at least one through-substrate trench, surrounding the at least one micro-reactor and the one or more micro-fluidic channels. The trench may be made by locally removing all substrate material over the complete thickness of the substrate. The trench may surround the at least one micro-reactor as completely as possible, e.g., only leaving space for allowing micro-fluidic channels to connect to the micro-reactor.

It is an advantage of embodiments of the present invention that, although the micro-reactor and the micro-fluidic channel(s) are provided in a heat-conductive semiconductor substrate, that due to the presence of the through-substrate trench, the micro-reactor and the one or more micro-fluidic channels are thermally insulated from the remainder of the substrate carrying other components.

In embodiments of the present invention, the one or more micro-fluidic channels may be winded partly or multiple times around the micro-reactor. This increases the thermal insulation, as thermal insulation of the micro-reactor depends on the length of the micro-fluidic channel. A channel winded around the micro-reactor provides a better thermal insulation/consumed area ratio than a straight channel of same length.

A micro-fluidic device according to embodiments of the present invention may further comprise a means for heating or cooling the at least one micro-reactor.

In accordance with embodiments of the present invention, the through-substrate trench may be an air gap. Still air is generally known to be a good thermal insulator. In accordance with alternative embodiments of the present invention, the through-substrate trench may be filled with thermally insulating material.

In a micro-fluidic device according to embodiments of the present invention, the sealing cover layer, such as a Pyrex wafer, may be anodically bonded to the semiconductor substrate for sealing the micro-fluidic channels. Alternatively, the cover layer may for example be adhesively bonded or fusion bonded to the semiconductor substrate.

In another aspect, the present invention provides a micro-fluidic system comprising an array of micro-fluidic devices according to embodiments of the first aspect of the present invention. A micro-fluidic system according to embodiments of the present invention may further comprise a temperature control system for controlling the temperature of a plurality of micro-reactors.

A micro-fluidic system according to embodiments of the present invention may further comprise one or more valves, pumps and/or detectors.

In yet another aspect, the present invention provides a method for manufacturing a micro-fluidic device. The method comprises:

providing a semiconductor substrate, e.g. a silicon substrate, having a front side and a back side;

providing at least one micro-reactor in the semiconductor substrate;

providing one or more micro-fluidic channels in the front side of the semiconductor substrate, connected to the at least one micro-reactor;

sealing the micro-fluidic channels by bonding of a cover layer, e.g. anodic bonding of a Pyrex layer, to the front side of the semiconductor substrate; and thereafter, from the semiconductor backside, providing at least a partial etch for forming at least one through-substrate trench substantially completely surrounding the at least one micro-reactor and the one or more micro-fluidic channels.

By providing the through-substrate trenches only after sealing the micro-fluidic channels by a cover layer, the mechanical robustness of the device to be handled during further processing is increased, hence it becomes possible to handle such device with standard automated machines.

In embodiments of the present invention, providing at least a partial etch from the semiconductor backside for forming at least one through-substrate trench may comprise completely forming the trench from the backside of the substrate. In alternative embodiments, providing at least a partial etch from the semiconductor backside for forming at least one through-substrate trench may comprise partly forming the trench from the front side of the substrate and partly forming the trench from the backside of the substrate. In this embodiment, first structures are provided in the semiconductor substrate from its front side where the trench is to be provided, and then, after bonding of the cover layer, the remainder of the through-substrate trench is formed from the backside of the semiconductor substrate.

Providing micro-fluidic channels may comprise providing micro-fluidic channels winded partly or multiple times around the micro-reactor.

A method according to embodiments of the present invention may further comprise providing means for heating or cooling the micro-reactor.

In a method according to embodiments of the present invention, providing a through-substrate trench from the semiconductor backside may comprise grinding the semiconductor substrate and performing back side lithography, and patterning and etching the through-substrate trench.

It is an advantage of embodiments of the present invention that heat dissipation towards other components on the micro-chip from these thermally insulated micro-reactors is minimized while a sufficient degree of robustness of the device is maintained.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
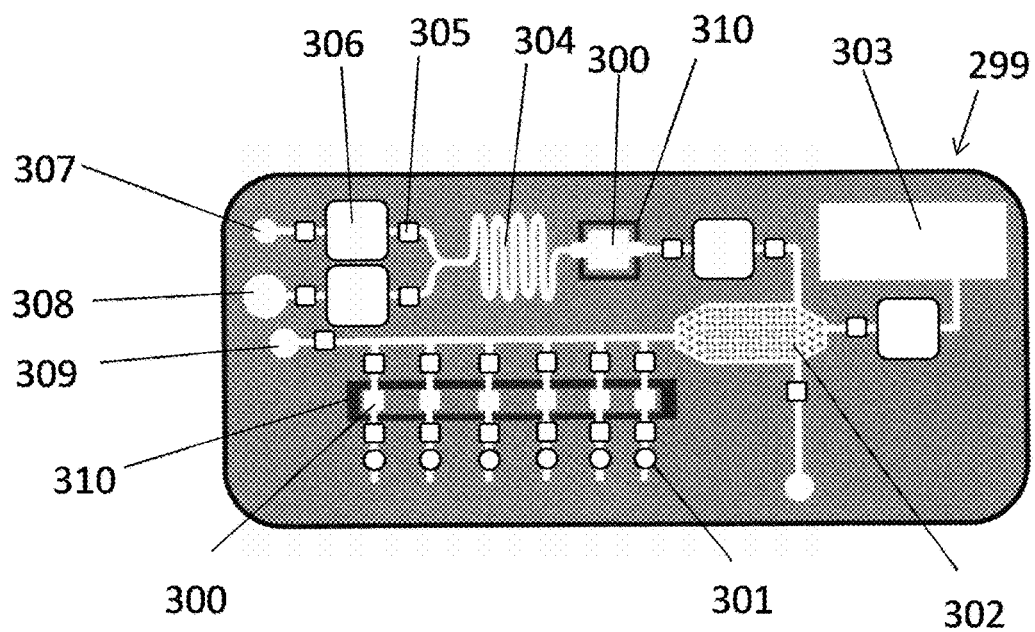
FIG. 1 illustrates a lab-on-chip implementation according to embodiments of the present invention for DNA amplification.

The drawings are only schematic and are non-limiting. In the drawings, the size of some of the elements may be exaggerated and not drawn on scale for illustrative purposes.

The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims.

The terms first, second and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

A. Introduction

A Single Nucleotide Polymorphism (SNP) is a difference in the DNA sequence of one nucleotide only. In humans, SNP's can result in differences in reactions to drugs and predisposition to illness; thus, cost effective and efficient SNP detection can play an important role in personalized medical care. For fast, sensitive and highly specific SNP detection a Lab-on-a-Chip (LoC) system can be used. A representative example of such a Lab-on-a-Chip system 299 and of its functionality is given in FIG. 1.

The Lab-on-a-Chip system 299 comprises reaction chambers 300 and other components for performing micro-fluidic actions, such as for example, without being exhaustive, reservoirs 307 for liquids to be inspected, such as e.g. blood, reservoirs 308 for reagents, reservoirs 309 for waste, pumps 306 for pumping liquids from reservoirs 307, 308 towards micro-fluidic channels, a mixer 304 for mixing, e.g., liquids to be inspected and reagents, valves 305 at different places in the micro-fluidic system, a mobile phase 303 and separation column 302 which together form a simple system for on chip high performance liquid chromatography, detectors 301 for detecting features of the liquid to be inspected.

As can be seen in FIG. 1, according to embodiments of the present invention, a full depth thermal insulation trench 310 is separating the micro-reaction chamber 300 from the other components for thermal conductive purposes. This is because thermal insulation of a micro-reaction chamber 300 from the rest of the chip is desired in terms of heating only locations where, e.g., PCR has to take place, and not inducing reactions elsewhere or damaging temperature sensitive components like, e.g., detectors. On the other hand, if the micro-reaction chamber 300 is thermally insulated from the rest of the chip, less power is needed to heat the reaction chamber, and the heating time is faster. Disadvantage is that, due to the thermal insulation, cooling time is slower; hence, cooling means may need to be provided.

In embodiments of the present invention, as illustrated in the top part of FIG. 1, each micro-reactor 300 may be wrapped by a thermal insulation trench individually. Alternatively, as illustrated in the bottom part of FIG. 1, a plurality of micro-reactors 300 may be separated from the other components by a common thermal insulation trench. On a single chip, a combination of both embodiments may be implemented, i.e., at least one micro-reactor 300 may be individually wrapped by a thermal insulation trench 310, while at the same time, at another location on the chip, a plurality of micro-reactors 300 are wrapped by a common thermal insulation trench 310.

The Lab-on-a-Chip system of FIG. 1 is mainly composed of semiconductor based, e.g., silicon based, components fabricated on the same chip, but valves, pumps and detectors may be fabricated separately and may be later assembled. Silicon is particularly advantageous as a semiconductor substrate material in view of its biocompatibility. Furthermore, the use of silicon is advantageous as it is a material with well-known properties, and the technologies for its processing are well advanced. In embodiments of the present invention an improved fabrication method of the semiconductor based, e.g., Si based, components is introduced and the characterization of a crucial element of the chip is presented: the micro-reactor where for example DNA amplification may be performed.

B. Thermally Insulated Structures FIG. 1 schematically illustrates a Lab-on-Chip system which may be used for multiple SNP detection. Fluid to be inspected, e.g., blood, and reagents are loaded in appropriate reservoirs 307, 308; two pumps 306 push them through a mixer 304 into a micro-reactor 300 where DNA amplification (PCR) may take place. As an example, a number, N, of fragments of well defined length and containing the sequences where SNP might be present are amplified. The fluid is sent then to a filter 302, for example made of semiconductor, e.g., silicon, pillars having a pre-determined inter-pillar distance of for example 1-2 um. Here, the N DNA components are spatially separated, according to the principle of high-performance liquid chromatography, and are routed each to a dedicated detector 301, which detects the presence of SNP.

It is an object of embodiments of the present invention to reduce heat dissipation from micro-reactors 300 to surrounding components on a micro-chip.

In the embodiment illustrated in FIG. 1, heat is dissipated from the micro-reactor 300 where the DNA amplification takes places. The heat that is dissipated may affect surrounding components on the micro-chip or may affect other micro-reactors 300 if, e.g., an array of micro-reactors is used on the same chip.

In a first aspect of the present invention, a micro-fluidic device is proposed which thermally insulates a micro-reactor, which is a heatable microstructure, from other components on a micro-chip whilst maintaining a mechanical robust construction of the device. The invention proposes a technique whereby a through-substrate trench substantially surrounding the micro-reactor, is created. With "substantially surrounding" is meant that the trench covers as much as possible of the circumference of the micro-reactor, e.g., at least 50% thereof, e.g., at least 75% thereof, such as at least 80% thereof or at least 90% thereof. In ideal embodiments, the through-substrate trench would completely surround the micro-reactor. This, however, is not possible if an access to the micro-reactor needs to be provided, such as for example with a micro-reactor, where a micro-fluidic channel is connected to that micro-reactor for delivering fluids thereto or for evacuating fluids therefrom. In such cases, the through-substrate trench surrounds the heatable micro-reactor substantially completely, except at that location or those locations where connections are made to the micro-reactor, e.g., by means of the one or more micro-fluidic channels.

To optimize the thermal insulation properties of the micro-reactor, in accordance with embodiments of the present invention the trench is created at full depth of the semiconductor substrate. The proposed invention does not require a carrier wafer for manufacturing the through-substrate trench. Contrary thereto, it provides an anodic bond of the semiconductor substrate, e.g., Si, to a cover layer, e.g., a Pyrex wafer, for sealing micro-fluidic channels prior to providing the full-depth etch of the insulation trench, which is advantageous for mechanical robustness, allows for more complicated thermal insulation trench geometries, and is compatible with automated wafer handling systems typical of mass production tools used in silicon technology.

Figure 2:
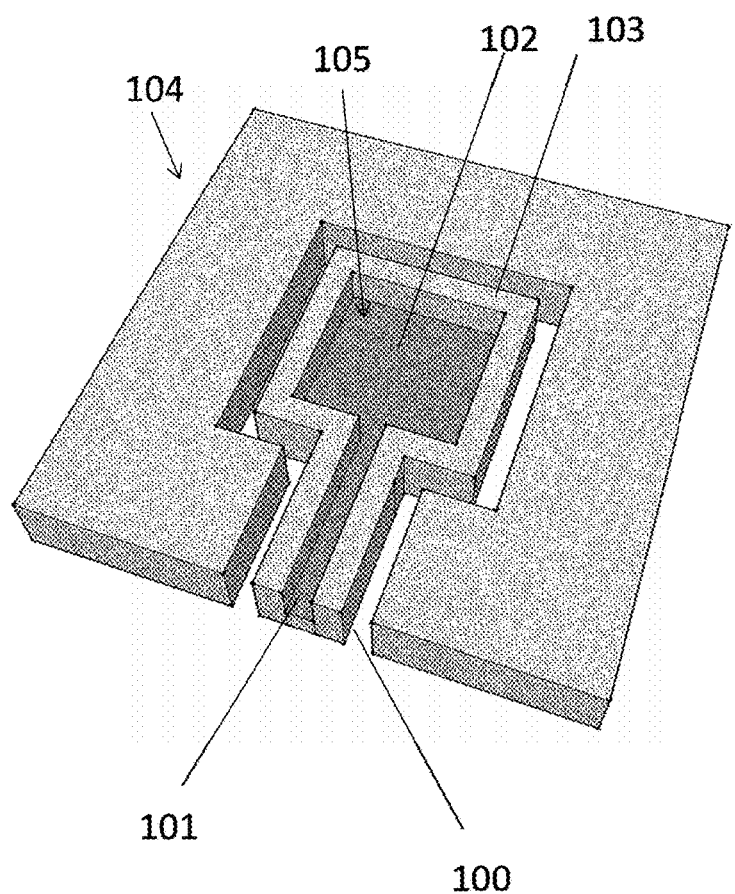
FIG. 2 illustrates a 3D view of a micro-fluidic device according to a first embodiment of the present invention.
Figure 3:
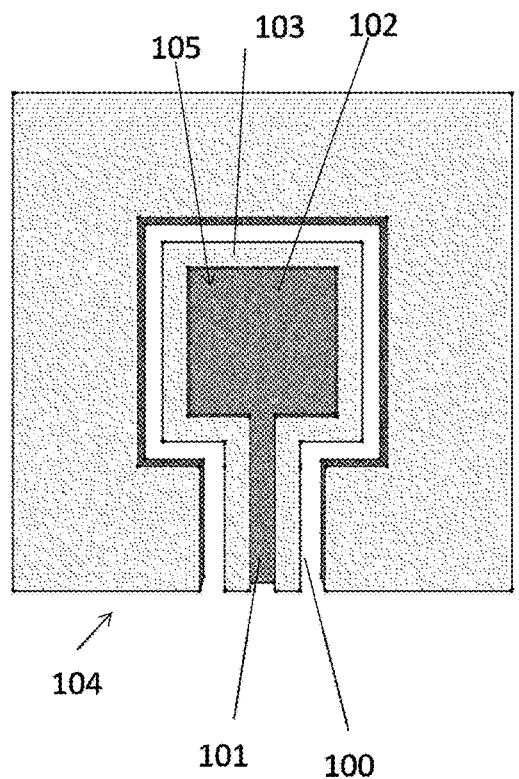
FIG. 3 illustrates a top view of the micro-fluidic device of FIG. 2.

FIG. 2 and FIG. 3 illustrate a first embodiment of the present invention. FIG. 2 illustrates a 3D version of a micro-fluidic device 104 according to embodiments of the present invention, and FIG. 3 illustrates a top view of the same micro-fluidic device 104. The micro-fluidic device 104 is made in a semiconductor substrate, e.g., a silicon substrate, and comprises a micro-reactor 105 and at least one micro-fluidic channel 101 connected to the micro-reactor 105. The micro-reactor 105 comprises a cavity 102, and a semiconductor substrate wall 103, e.g., a silicon wall, forming the micro-reactor 105. Also the micro-fluidic channel 101 is confined by a substrate wall 103. A full depth trench 100, i.e., a trench completely through the semiconductor substrate, surrounds the micro-reactor 105. This full depth trench 100 fulfils the purpose of a thermal insulation gap (air). The full depth trench 100 ensures that the micro-reactor 105 is not thermally connected to the rest of the micro-chip built on the same substrate and its surrounding components. To transport liquid to and from the micro-reactor 105, a channel 101 is connected to the cavity 102 of the micro-reactor 105. The channel 101 is separated from the micro-chip and its surrounding components by means of the full depth trench 100.

It is an object of embodiments of the present invention to still further reduce heat conduction of the micro-reactor 105. To further reduce heat conduction, in accordance with embodiments of the present invention, the channel 101 can be winded at least partly, i.e., partly, completely or even multiple times, around the micro-reactor 105.

Figure 4:
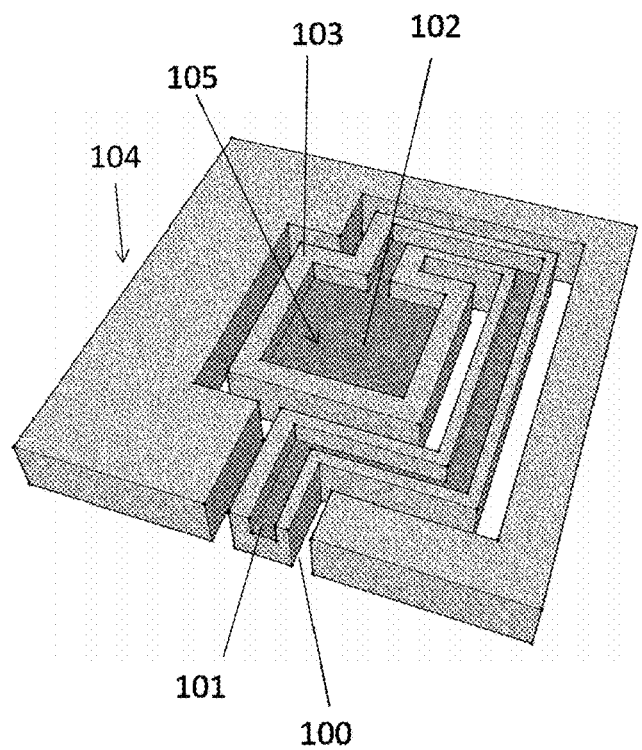
FIG. 4 illustrates a 3D view of a micro-fluidic device according to a second embodiment of the present invention.
Figure 5:
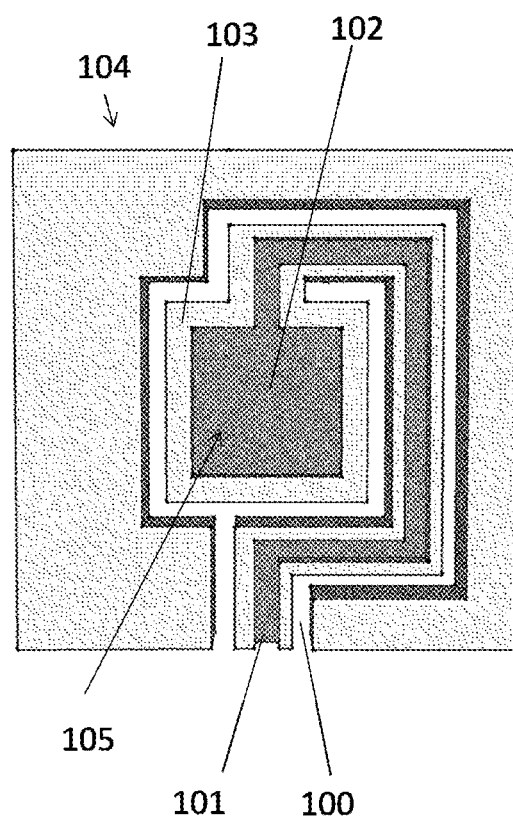
FIG. 5 illustrates a top view of the micro-fluidic device of FIG. 4.

FIG. 4 and FIG. 5 illustrate one example of such embodiment of the present invention. FIG. 4 illustrates a 3D version of a micro-fluidic device 104 with a micro-fluidic channel 101 partially winded around the micro-reactor 105, and FIG. 5 illustrates a top view of the same micro-fluidic device 104. In such embodiments of the present invention, the channel 101 is at least partly winded around the micro-reactor 105 to further reduce heat conduction. The micro-reactor 105 is separated from the channel 101 by means of a full depth trench 100, i.e., a trench which goes completely through the semiconductor substrate, which fulfills the purpose of a thermal insulation gap. The thermal insulation gap is a full depth trench ensuring that the channel 101 and the micro-reactor 105 are not physically, hence not thermally, connected via thermally conductive solid material. Also the channel 101 is separated from other components of the micro-chip by means of a full depth trench 100, which also fulfills the purpose of a thermal insulation gap. Hence, in accordance with embodiments of the present invention, both the micro-reactor 105 and the at least one micro-fluidic channels 101 are surrounded by a through-substrate trench 100. In the embodiment illustrated in FIG. 4 and FIG. 5, it is a single continuous trench 100 which surrounds both the micro-reactor 105 and the micro-fluidic channel 101.

Figure 6:
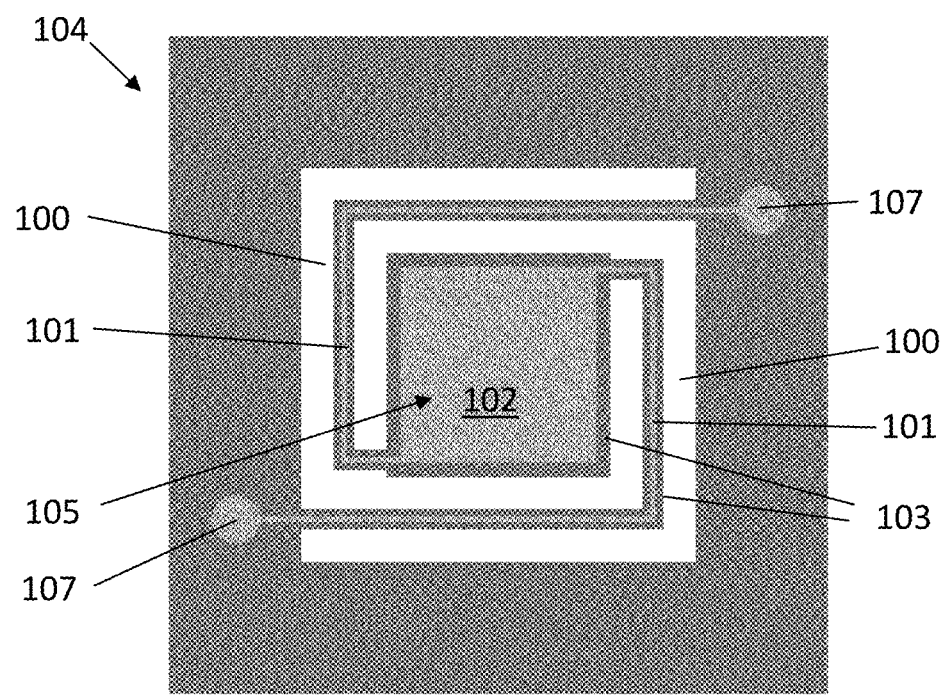
FIG. 6 illustrates a top view, FIG. 7 a cross-sectional view and FIG. 8 a 3D view of a micro-fluidic device according to a third embodiment of the present invention.
Figure 7:
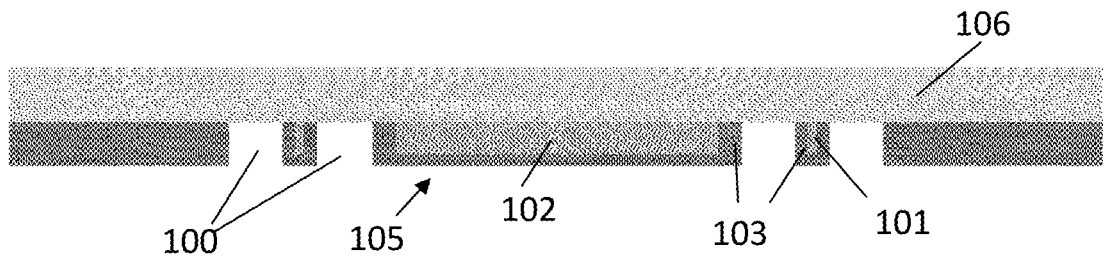

FIG. 6 and FIG. 7 illustrate another embodiment of the present invention. They illustrate a top view and a cross-sectional view, respectively, of the schematic of a thermal insulation solution for a micro-fluidic device 104 where two micro-fluidic channels 101 are connected to a micro-reactor 105. Each of the channels 101 is partly winded around the micro-reactor 105. The micro-reactor is attached to two channels 101 for transporting liquid to and from the micro-reactor 105. In the embodiment illustrated, the channels 101 are each partly winded around the micro-reactor to reduce further heat conduction.

FIG. 7 illustrates a sectional view of a micro-reactor 105 whereby two channels 101 are connected to the micro-reactor 105. The micro-reactor 105 and the two channels 101 are insulated from each other and from other surrounding components on the micro-chip by means of a full depth trench 100. The micro-fluidic components such as the micro-fluidic channels 101 and the cavity 102 are sealed by a top cover 106, for example, a Pyrex cover or a Schott glass 33 cover, or a cover of another material, e.g., glass, suited for anodic bonding. Pyrex is particularly advantageous as material forming the top cover, in view of its biocompatibility.

FIG. 6 illustrates a top view of the thermally insulated micro-reactor 105. From this figure it is clear that the channels 101 are each partly winded around the micro-reactor 105, i.e., the channels 101 do not describe the complete circumference of the micro-reactor 105.

In embodiments of the present invention, not illustrated in the drawings, the micro-reactor 105 is connected to one or more channels which are insulated from each other by means of a full depth trench 100 and are fully or even multiple times winded around the micro-reactor 105.

In particular embodiments of the present invention, as for example illustrated in FIG. 1, a plurality of micro-reactors 300 are located on the same micro-chip whereby the micro-reactors 300 and their connected micro-fluidic channels 101 are separated from one another other via a full depth etch insulation trench 310. It is an advantage of this embodiment that the thermal insulation provided by the full-depth trench reduces the thermal mass of the insulated devices and hence allows rapid heating rates and allows individual micro-reactors to be controlled to pre-set thermocycling conditions, independent of neighboring reaction cavities when an array format is used. The capability of loosing heat, hence cooling, is reduced, but this can be solved by adding an additional cooling component.

Alternatively, a plurality of micro-reactors 300 may be clustered together inside a single insulation trench 310, thus providing thermal insulation between the plurality of micro-reactors 300 and the remainder of the chip. It is an advantage of this embodiments that the thermal insulation provided by the full-depth trench allows heating and/or cooling of the plurality of micro-reactors 300 without at the same time substantially changing the temperature of other micro-fluidic components present in the surrounding substrate.

In particular embodiments of the present invention, the micro-reactor 105, 300 further comprises a means for heating and/or cooling the micro-reactor. The means for heating and/or cooling the micro-reactor 105, 300 may be provided at the bottom of the cavity 102. The means for heating and/or cooling may be protected from biological material by a layer of protection material, for example a thin layer of silicon nitride. The means for heating may be a micro-heater, for example, a platinum micro-heater. The heater may be provided in the form of a resistor. The means for cooling may be a thermoelectric cooler.

In particular embodiments of the present invention, a temperature control system can be used to control individual heating or cooling means of the micro-reactors. In embodiments of the present invention, the temperature control system delivers a variable power to the micro-reactor cavity depending on target and actual cavity temperatures. It may also control the current in the thermoelectric cooler to provide cooling when needed.

Figure 8:
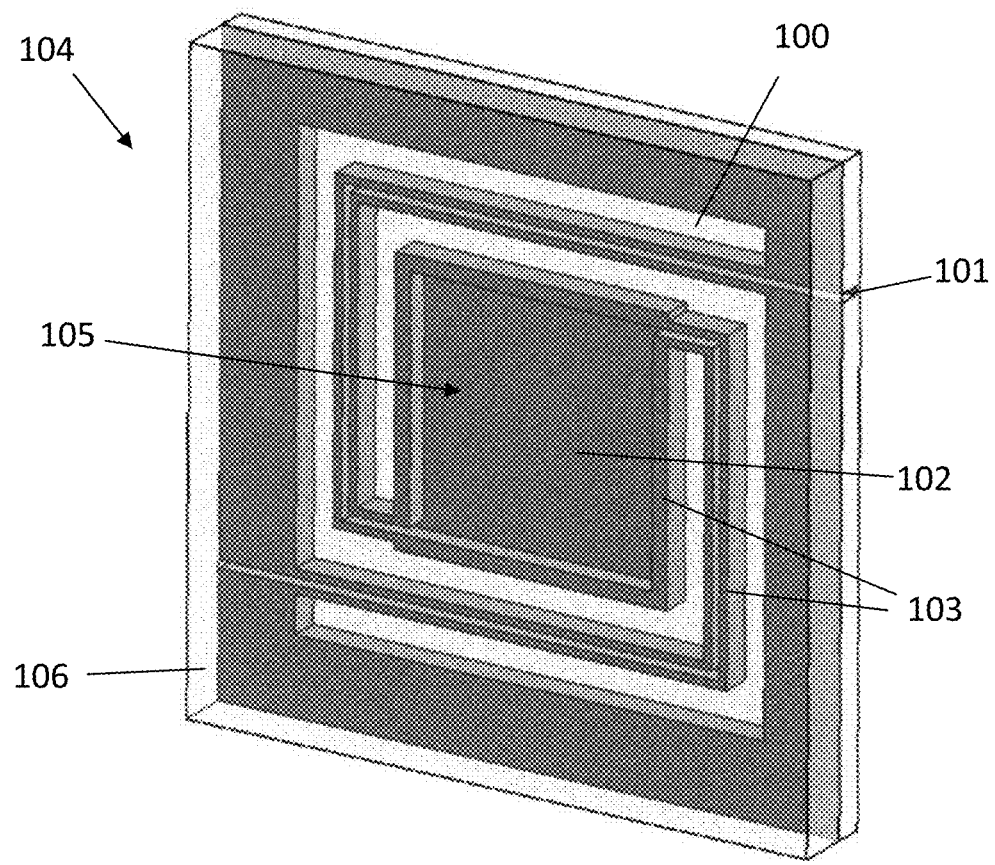

FIG. 8 illustrates a 3D view of the micro-fluidic device 104 illustrated in top view in FIG. 6 and in cross-section in FIG. 7.

In the next section, the fabrication of such insulated micro-reactor 105 is explained in detail.

C. Fabrication

In a second aspect, the present invention provides a method for manufacturing a device comprising at least one thermally insulated micro-reactor 105 and one or more micro-fluidic channels 101.

The fabrication comprises three major parts:

1) providing, for example, by etching, the fluidic structures, comprising at least one micro-reactor and one or more micro-fluidic channels in a semiconductor substrate;

2) sealing the micro-fluidic structures by bonding of a cover layer, e.g., a Pyrex wafer, to the front side of the semiconductor substrate, the bonding for example being any or anodic bonding, adhesive bonding using appropriate bonding material, or fusion bonding; and 3) providing a through-substrate trench from the backside of the substrate, the trench substantially completely surrounding the at least one micro-reactor and the one or more micro-fluidic channels.

Figure 9:
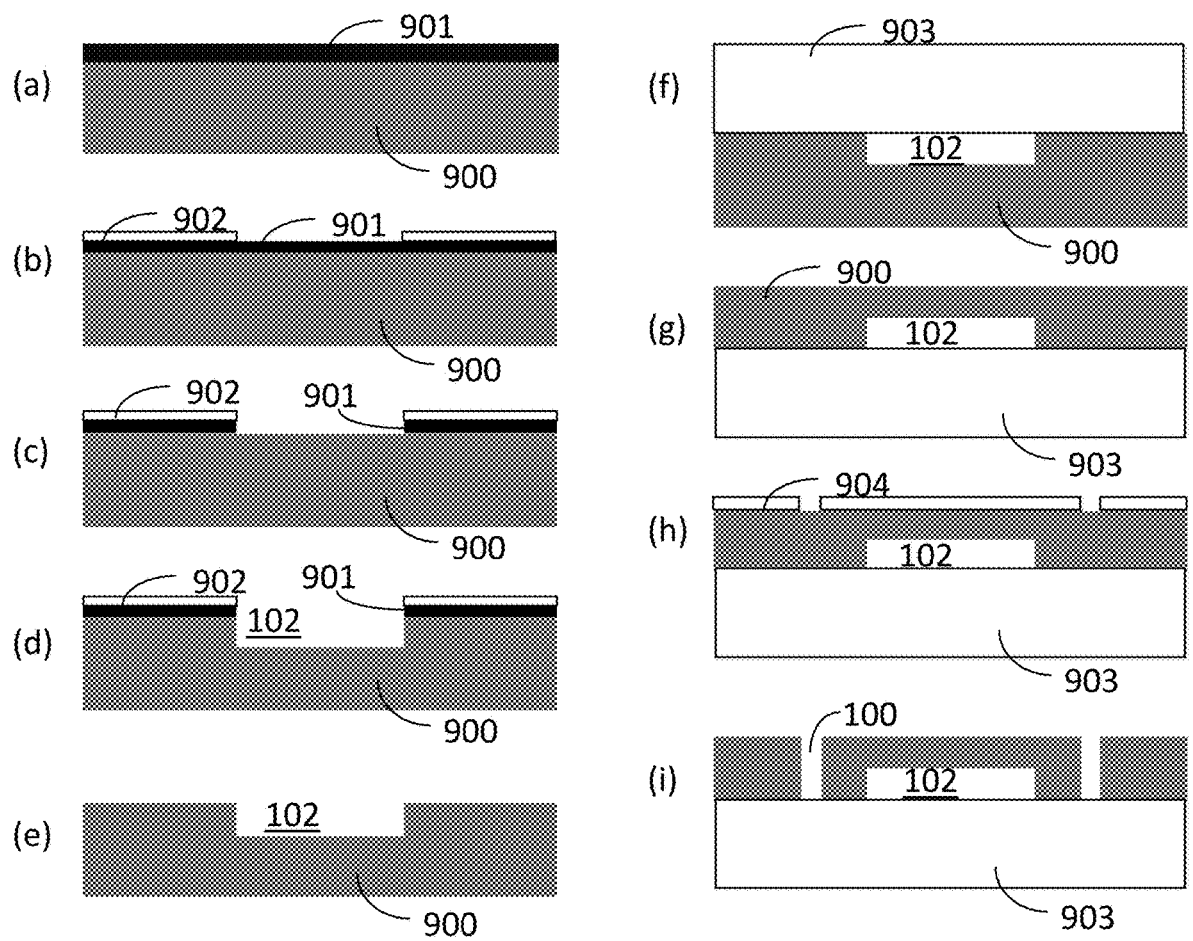
FIG. 9 illustrates different processing steps to create thermal insulation structures according to a first method embodiment of the present invention.

FIG. 9 illustrates a schematic of a first embodiment of a process flow according to the present invention:

a) A semiconductor substrate 900 is provided. The semiconductor substrate 900 has a front side and a back side. On top of the front side of the semiconductor substrate 900, a hard mask layer 901, for example an oxide layer, is formed; for example, an oxide layer with a pre-determined thickness, e.g., 1000 nm, may be deposited. Such hard mask layer is preferred over simply using a resist layer because if deep structures must be etched, a thick resist layer has to be provided, which is inconvenient if small CD structures must be etched.

b) The micro-fluidic structures and in particular the micro-reactor cavity 102, and optionally other microstructures, are defined in the hard mask 901. Hereto, resist material 902 is provided, e.g., spun, on top of the hard mask layer 901, and is appropriately patterned.

c) The hard mask layer 901 is etched using the patterned resist layer 902, so as to define a mask for etching the micro-fluidic structures.

d) The micro-fluidic structures, such as for example the cavity 102 and the micro-fluidic channels 101 are etched in the semiconductor substrate 900.

e) The resist material 902 and the hard mask material 901 are stripped, thus, yielding the semiconductor substrate 900 with the fine micro-fluidic structures.

f) The semiconductor substrate is bonded, e.g., anodically bonded, to a cover layer 903, for example a Pyrex cover layer, for sealing the micro-fluidic structures.

g) The semiconductor substrate 900 may optionally be grinded from the backside.

h) A layer of resist material 904 is provided, e.g., spun, to the back side of the semiconductor substrate 900, and is appropriately patterned for forming a lithographic mask for defining the through-substrate trenches 100.

i) The through-substrate trenches are etched from the backside of the semiconductor substrate 900, using the patterned resist layer 904.

Figure 10:
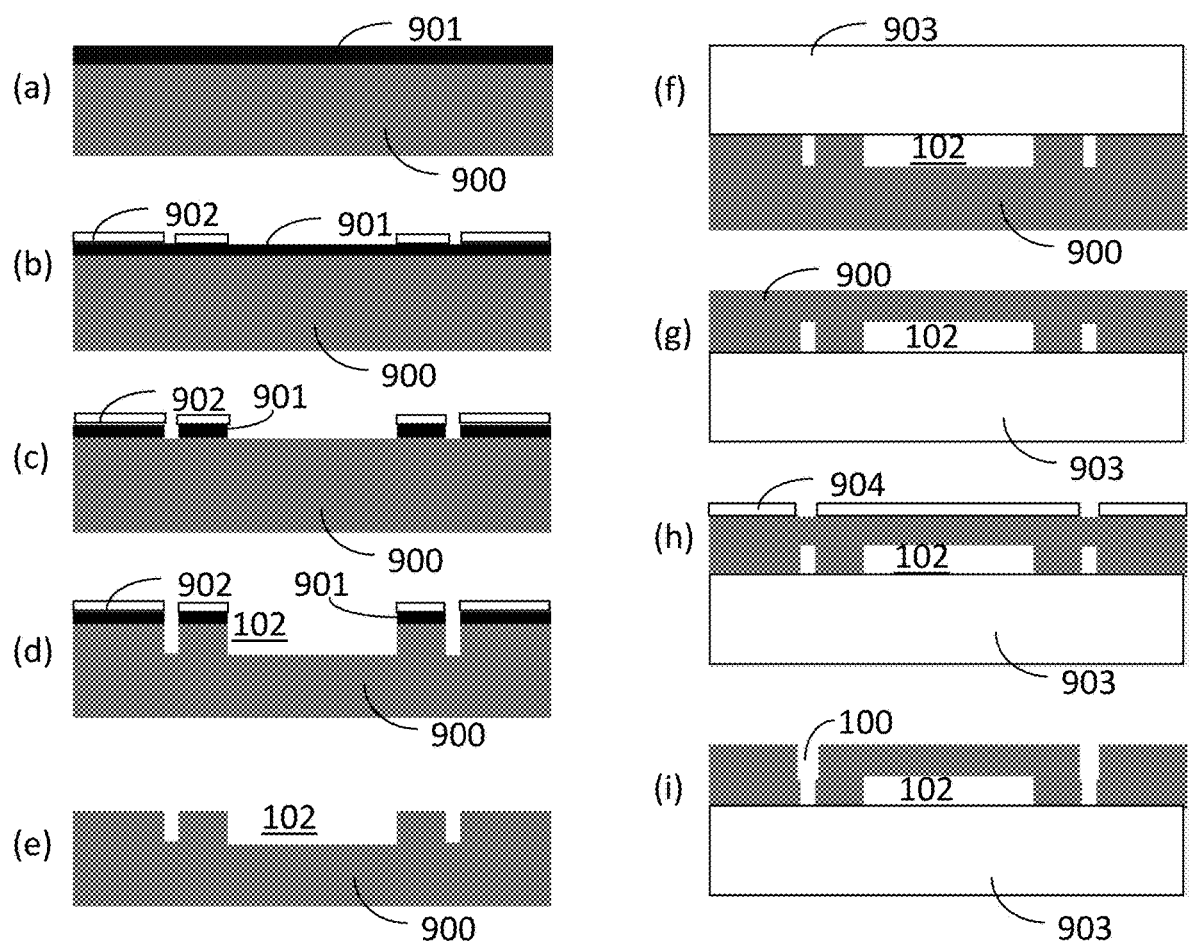
FIG. 10 illustrates different processing steps to create thermal insulation structures according to a second method embodiment of the present invention.

FIG. 10 illustrates a schematic of a second embodiment of a process flow according to the present invention:

a) A semiconductor substrate 900 is provided. The semiconductor substrate 900 has a front side and a back side. On top of the front side of the semiconductor substrate 900, a hard mask layer 901, for example, an oxide layer, is formed; for example, an oxide layer with a pre-determined thickness, e.g., 1000 nm, may be deposited.

b) The micro-fluidic structures and in particular the micro-reactor cavity 102, and optionally other microstructures, are defined in the hard mask 901, as well as the position of the trenches 100. Hereto, resist material 902 is provided, e.g., spun, on top of the hard mask layer 901, and is appropriately patterned.

c) The hard mask layer 901 is etched using the patterned resist layer 902, so as to define a mask for etching the micro-fluidic structures and part of the trenches 100.

d) The micro-fluidic structures, such as for example the cavity 102 and the micro-fluidic channels 101, and a part of the trenches 100 are etched in the semiconductor substrate 900. At this moment, the trenches 100 are only provided up to limited depth, e.g., the same depth as the micro-fluidic structures provided. Both micro-fluidic structures and part of the trenches 100 may be provided in a single etch step.

e) The resist material 902 and the hard mask material 901 are stripped, thus yielding the semiconductor substrate 900 with the fine micro-fluidic structures and part of the trenches.

f) The semiconductor substrate is bonded, e.g., anodically bonded, to a cover layer 903, for example, a Pyrex cover layer, for sealing the micro-fluidic structures.

g) The semiconductor substrate 900 may optionally be grinded from the backside.

h) A layer of resist material 904 is provided, e.g., spun, to the back side of the semiconductor substrate 900, and is appropriately patterned for forming a lithographic mask for defining the second part of the through-substrate trenches 100.

i) The second part of the through-substrate trenches 100 is etched from the backside of the semiconductor substrate 900, using the patterned resist layer 904.

It is an advantage of method embodiments of the present invention that the anodic bonding between the semiconductor substrate 900 and the cover wafer 903 is performed before completely providing the through-substrate trenches 100—hence either before etching of the through-substrate trenches 100 is started, or after a partial etch of the through-substrate trenches 100. Not only does this increase the mechanical strength, hence, the robustness of the device, it also allows using standard handling equipment: if full holes are provided through the semiconductor substrate, clamping to vacuum chucks becomes impossible and the use of robot arms for wafer loading/unloading can easily cause wafer break.

In particular embodiments of the present invention, sample inlet and outlet openings 107 may be provided, e.g., etched, through the semiconductor substrate. This is not shown in the process flows, but such inlet and outlet openings 107 are illustrated in FIG. 6.

D. Characterization

In the context of the present invention, focus is put on the thermal properties of the micro reactor 105. Schematics of one embodiment are shown in FIG. 6 to FIG. 8.

In a particular embodiment, the micro-reactor 105 consists of a 3 μl cavity 102 about 300 μm deep. High thermal insulation of the reaction chamber from the remaining of the chip is obviously of paramount importance, but in the art difficult to realize, because of the high thermal conductivity of semiconductor substrate material, e.g., silicon. In accordance with embodiments of the present invention, the problem has been solved by providing a through-substrate insulation trench 100 around the micro-reactor 105. This etch step for making the insulation trench 100 may at the same time be exploited for opening micro-fluidic ports to the micro-fluidic channels 101.

Thanks to the fact that the etch of the trench 100 is performed at least partially after anodic bonding, it is possible to completely eliminate semiconductor material, e.g., silicon, from the trench 100. Thermal insulation has been further augmented by using long, thermally insulated micro-channels 101 for the inlet and outlet to the micro-reactor 105.

In an embodiment of the invention and in order to reduce the used semiconductor area, in accordance with embodiments of the present invention, the micro-channels 101 are winded around the micro-reactor 105. The effectiveness of the design is confirmed by experimental results: when the temperature of the micro-reactors 105 is close to 100° C. the temperature of the surrounding part of the chip is only a few degrees above the ambient.

Figure 11:
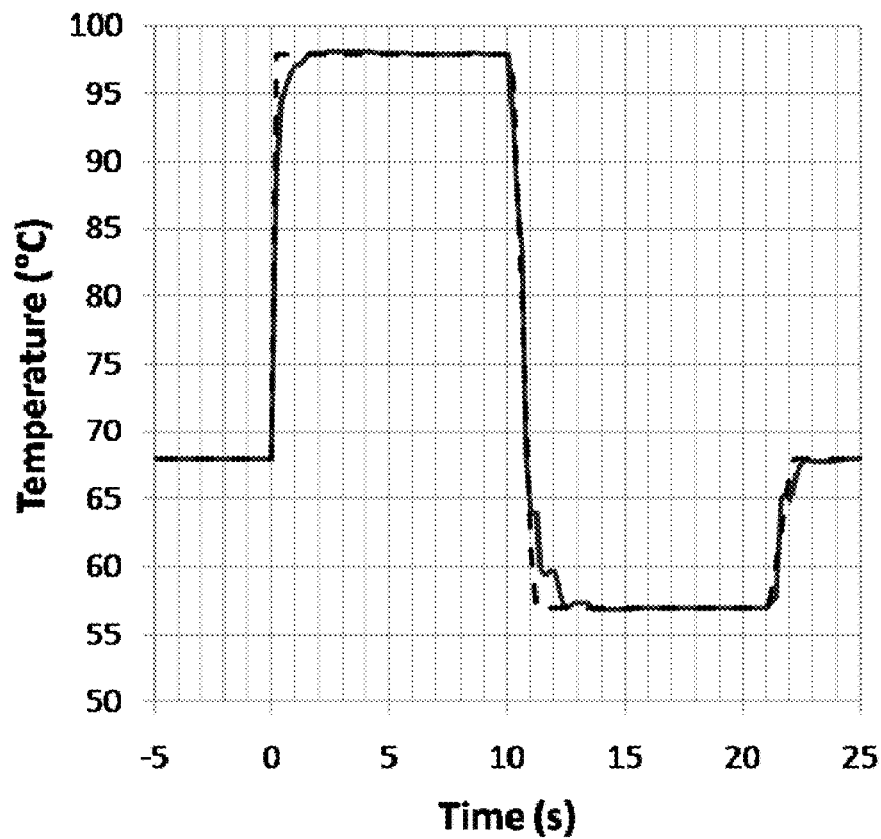
FIG. 11 illustrates a graph of temperature changes in a micro-reactor insulated in accordance with embodiments of the present invention.

It is an advantage of embodiments of the present invention that, due to the presence of the full-depth trench 100 around the micro-reactor 105 and the micro-fluidic channels 101, a fast temperature cycling in micro-reactors can be ensured. This allows a temperature cycle as for example illustrated in FIG. 11 to be repeated a large number of times in a micro-reactor insulated in accordance with embodiments of the present invention.

Indeed, due to the thermal insulation by the trench 100, the thermal mass of that piece of semiconductor substrate comprising the micro-reactors 105 which is actually heated is reduced (thanks to the trench 100 substantially only the micro-reactor 105 is heated, and substantially no surrounding substrate), which allows fast temperature cycling. In an embodiment of the invention, an appropriate temperature control system is utilized in combination with each of the plurality of micro-reactors 105. Thus, by embodiments of the present invention an advanced thermal solution is developed and experimental heating times of less than 1.5 sec from 68° C. to 98° C. and cooling times of less than 2.5 sec from 98° C. to 57° C. (see FIG. 11) are demonstrated. It can be seen from this graph that in accordance with embodiments of the present invention fast micro reactor temperature cycling is possible after careful optimization of the various components of the thermal solution.

Figure 12:
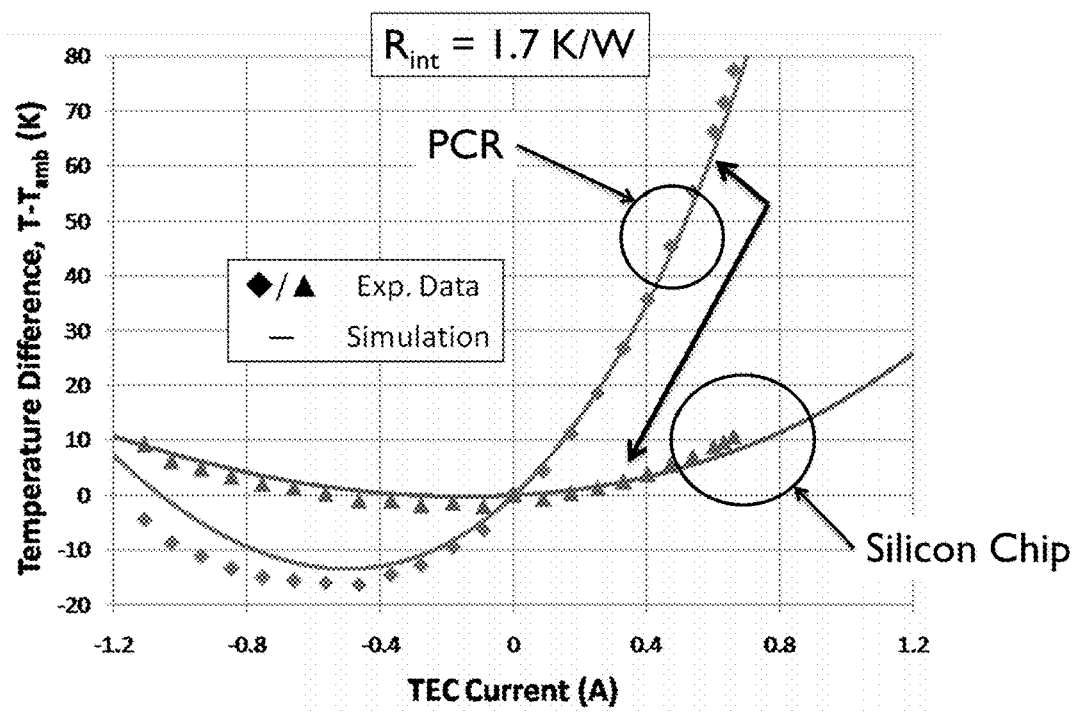
FIG. 12 illustrates temperature differences in a micro-reactor and a micro-chip according to embodiments of the present invention.

FIG. 12 illustrates experimental results of the thermal insulation solution in accordance with embodiments of the present invention. It should be noticed that while the temperature of the micro-reactor (PCR) is increasing, the increase of the temperature of the micro-chip (silicon chip) is not proportional to the increase of the temperature of the micro-reactor. This proves that the thermal insulation gap by means of a full depth trench is good solution.

The invention claimed is:

1. A micro-fluidic device comprising:
   a semiconductor substrate;
   a micro-reactor in the semiconductor substrate, wherein the micro-reactor comprises a cavity within a cavity wall;
   one or more micro-fluidic channels in the semiconductor substrate, each formed within respective channel walls, each connected to the cavity at a respective location along the cavity wall, and each winded, from its respective location and over its respective channel length, more than 90 degrees around the micro-reactor and the cavity;
   one or more through-substrate trenches that, together, (i) surround the micro-reactor except at each respective location of each of the one or more micro-fluidic channels, and (ii) are disposed outside the respective channel walls of the one or more micro-fluidic channels and are continuous along the respective channel length of each of the one or more through-substrate trenches, wherein the one or more through-substrate trenches surround the micro-reactor and the one or more micro-fluidic channels for at least 50% of a circumference of the one or more through-substrate trenches; and a cover layer bonded to the semiconductor substrate for sealing the one or more micro-fluidic channels and forming a top cover of the one or more through-substrate trenches.

2. The micro-fluidic device according to claim 1, wherein each of the one or more through-substrate trenches is an air gap.

3. The micro-fluidic device according to claim 2, wherein each air gap is filled with thermally insulating material.

4. The micro-fluidic device according to claim 1, wherein the cover layer is anodically bonded to the semiconductor substrate.

5. The micro-fluidic device according to claim 1, further comprising a temperature control system for controlling temperature of the micro-reactor.

6. The micro-fluidic device according to claim 1, wherein the one or more through-substrate trenches substantially surround each of the one or more micro-fluidic channels.

7. A micro-fluidic system, the micro-fluidic system comprising:
    an array comprising micro-fluidic devices, wherein at least one of the micro-fluidic devices comprises:
        a semiconductor substrate;
        a micro-reactor in the semiconductor substrate, wherein the micro-reactor comprises a cavity within a cavity wall;
        one or more micro-fluidic channels in the semiconductor substrate, each formed within respective channel walls, each connected to the cavity at a respective location along the cavity wall, and each winded, from its respective location and over its respective channel length, more than 90 degrees around the micro-reactor and the cavity;
        one or more through-substrate trenches that, together, (i) surround the micro-reactor except at each respective location of each of the one or more micro-fluidic channels, and (ii) are disposed outside the respective channel walls of the one or more micro-fluidic channels and are continuous along the respective channel length of each of the one or more through-substrate trenches, wherein the one or more through-substrate trenches surround the micro-reactor and the one or more micro-fluidic channels for at least 50% of a circumference of the one or more through-substrate trenches; and
        a cover layer bonded to the semiconductor substrate for sealing the one or more micro-fluidic channels and forming a top cover of the one or more through-substrate trenches.

8. The micro-fluidic system according to claim 7, further comprising at least one valve.

9. The micro-fluidic system according to claim 7, further comprising at least one pump.

10. The micro-fluidic system according to claim 7, further comprising at least one detector.

11. The micro-fluidic system according to claim 7, wherein each of the one or more micro-fluidic channels is winded at least 180 degrees around the micro-reactor.

12. The micro-fluidic system according to claim 7, wherein the one or more through-substrate trenches substantially surround each of the one or more micro-fluidic channels.

13. A method for manufacturing a micro-fluidic device, the method comprising:
    providing a semiconductor substrate having a front side and a back side;
    providing a micro-reactor in the semiconductor substrate, wherein the micro-reactor comprises a cavity within a cavity wall;
    providing one or more micro-fluidic channels in the front side of the semiconductor substrate, each formed within respective channel walls, each connected to the cavity at a respective location along the cavity wall, and each winded from its respective location and over its respective channel length, more than 90 degrees around the micro-reactor and the cavity;
    providing one or more through-substrate trenches that, together, (i) surround the micro-reactor except at each respective location of each of the one or more micro-fluidic channels, and (ii) are disposed outside the respective channel walls of the one or more micro-fluidic channels and are continuous along the respective channel length of each of the one or more through-substrate trenches, wherein the one or more through-substrate trenches surround the micro-reactor and the one or more micro-fluidic channels for at least 50% of a circumference of the one or more through-substrate trenches;
    sealing the one or more micro-fluidic channels by bonding of a cover layer to the front side of the semiconductor substrate; and
    optionally thereafter, from the semiconductor backside, providing at least a partial etch for forming at least one of the one or more through-substrate trenches.

14. The method according to claim 13, wherein providing at least a partial etch from the semiconductor backside for forming the at least one of the one or more through-substrate trenches comprises completely forming the at least one or more through-substrate trenches from the backside of the substrate.

15. The method according to claim 13, wherein providing at least a partial etch from the semiconductor backside for forming the at least one of the one or more through-substrate trenches comprises partly forming the at least one of the one or more through-substrate trench[es] from the front side of the substrate and partly forming the at least one of the one or more through-substrate trench[es] from the backside of the substrate.

16. The method according to claim 13, wherein forming the at least one of the one or more through-substrate trenches comprises:
    grinding the semiconductor substrate and performing back side lithography; and
    patterning and etching the at least one of the one or through-substrate trenches.

* * * * *